US006218766B1

(12) United States Patent
Warnaka et al.

(10) Patent No.: US 6,218,766 B1

(45) Date of Patent: Apr. 17, 2001

(54) LOUDSPEAKER ASSEMBLY

(75) Inventors: Glenn E. Warnaka, State College; Mark E. Warnaka, Howard, both of PA (US)

(73) Assignee: Noise Cancellation Technologies, Inc., Linthicum, MD (US)

( * ) Notice: Subject to any disclaimer, the term of this patent is extended or adjusted under 35 U.S.C. 154(b) by 0 days.

(21) Appl. No.: 09/434,165

(22) Filed: Nov. 4, 1999

Related U.S. Application Data

(63) Continuation of application No. 08/878,696, filed on Jun. 19, 1997, now abandoned.

(51) Int. Cl.[7] .......... H01L 41/08

(52) U.S. Cl. .......... 310/322; 310/324; 310/321

(58) Field of Search .......... 310/312, 321, 310/322, 324, 330–332, 334, 337

(56) References Cited

U.S. PATENT DOCUMENTS

| | | | | |
|---|---|---|---|---|
| 3,209,176 | | 9/1965 | Paley | 310/8.2 |
| 3,253,674 | | 5/1966 | Desmares | 181/5 |
| 3,321,189 | | 5/1967 | Scarpa | 259/144 |
| 3,363,118 | | 1/1968 | Sims | 310/8.7 |
| 3,370,187 | | 2/1968 | Straube | 310/9.1 |
| 3,423,543 | | 1/1969 | Kompanek | 179/110 |
| 4,048,454 | * | 9/1977 | Barcus et al. | 310/324 |
| 4,401,857 | | 8/1983 | Morikawa | 179/110 A |
| 4,439,640 | | 3/1984 | Takaya | 179/110 A |
| 4,449,019 | | 5/1984 | Kakehi et al. | 179/110 A |
| 4,539,575 | | 9/1985 | Nilsson | 346/140 R |
| 4,654,554 | | 3/1987 | Kishi | 381/158 |
| 4,779,246 | | 10/1988 | Dietzsch et al. | 367/157 |
| 4,807,294 | * | 2/1989 | Iwata et al. | 310/322 X |
| 4,885,781 | | 12/1989 | Seidel | 381/159 |
| 4,969,197 | | 11/1990 | Takaya | 381/190 |
| 4,979,219 | | 12/1990 | Lin | 381/190 |
| 5,031,222 | | 7/1991 | Takaya | 381/190 |
| 5,119,840 | | 6/1992 | Shibata | 134/184 |
| 5,126,615 | | 6/1992 | Takeuchi et al. | 310/330 |
| 5,196,754 | | 3/1993 | Berthold et al. | 310/324 |
| 5,196,755 | | 3/1993 | Shields | 310/324 |
| 5,291,460 | | 3/1994 | Harada et al. | 367/140 |
| 5,386,479 | | 1/1995 | Hersh | 381/190 |
| 5,584,447 | | 12/1996 | Pla | 244/1 N |
| 5,684,884 | | 11/1997 | Nakaya et al. | 381/190 |
| 5,838,805 | * | 11/1998 | Warnaka et al. | 310/324 X |

* cited by examiner

*Primary Examiner*—Mark O. Budd

(74) *Attorney, Agent, or Firm*—Foley & Lardner

(57) ABSTRACT

An assembly for utilization in a loudspeaker system is disclosed. The assembly comprises a substantially flat piezoelectric element capable of being excited by applied electric potential, a diaphragm that is driven by the excited piezoelectric element, said diaphragm having a surface area that is at least 20 times the surface area of the piezoelectric element and at least one motion coupler which is attached to at least a portion of the outer perimeter of the piezoelectric element and on its underside to the diaphragm.

39 Claims, 4 Drawing Sheets

PRIOR ART

LOUDSPEAKER ASSEMBLY

This application is a continuation of Ser. No. 08/878,696 Jun. 19, 1997, now abandoned.

This invention relates to a novel speaker system wherein a piezoelectric element is used to drive a diaphragm that is significantly larger than the driving element.

BACKGROUND OF THE INVENTION

It is well known that piezoelectric materials deform when subjected to electrical voltages. This deformation occurs in such a way that the dimensions of the piezoelectric material expand and contract when an alternating voltage is applied. The piezoelectric material behaves like an electrical capacitor and can be described by the typical equation for capacitance $$C = \frac{Q}{V}$$

where c=capacitance
Q=electric Charge
V=applied Voltage.

The piezoelectric material is connected to an electric supply by suitable connections. As a result of the relationship shown above, both the voltage and electric charge supplied must be sufficient to create high forces and deformations of the material. Since the voltage and charge are applied to the entire volume of the piezoelectric material, there is a corresponding deformation of the entire volume.

Loudspeakers employing a piezoelectric transducer capable of propagating surface acoustic waves to drive a diaphragm have been proposed as an alternative to moving coil loudspeakers. Such a device was described by Martin in U.S. Pat. No. 4,368,401 and later in Takaya in U.S. Pat. No. 4,439,640. Both inventions dealt with attaching a disc shaped piezoelectric element to a diaphragm. Martin's device used a thick glue layer (10 to 50% of the carrier plate thickness) between a carrier plate and the piezoelectric ceramic. The adhesive layer served to attenuate resonance. Any displacement in the piezoelectric material is directly related to the applied electrical potential.

In both the Martin and Takaya patents, and in other similar art relating to electrically driven piezoelectric materials, the piezoelectric materials are used to drive diaphragms that are essentially the same size, in terms of surface area, as the piezoelectric materials. Therefore, it would be very costly to utilize the concepts of such patents and similar prior art to drive large, i.e. "Extended" diaphragms, in that piezoelectric materials are very expensive and a large single piezoelectric element or many smaller piezoelectric elements would be needed to drive comparatively sized diaphragms. Therefore it would be advantageous if piezoelectric materials could be adapted to drive diaphragms that are much larger in size that such piezoelectric materials.

BRIEF DESCRIPTION OF THE INVENTION AND THE DRAWINGS

The present invention utilizes a piezoelectric transducer to drive an extended, i.e., a comparatively large diaphragm relative to the size of the piezoelectric transducer utilized. The invention is described in greater detail relative to the attached drawings, wherein:

DETAILED DESCRIPTION OF THE INVENTION

Figure 1:
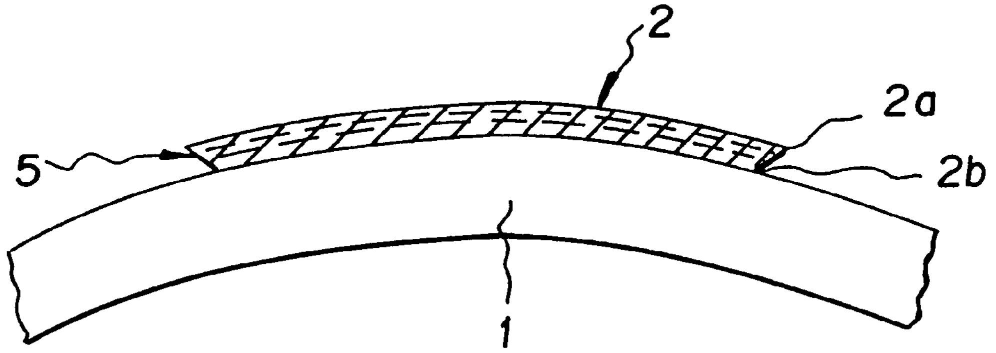
FIG. 1 depicts a prior art speaker.

Referring initially to FIG. 1 there is shown a sound radiating diaphragm 1 having a piezoelectric element 2 bonded to it. This arrangement is typical of the prior art, and in the drawing, for the sake of clarity, diaphragm 1 is depicted to be somewhat larger than piezoelectric element 2, although, as indicated above, in most prior art systems the piezoelectric transducer is generally approximately the same size as the diaphragm it is driving.

In practice, when piezoelectric element 2 is energized, it elongates and contracts depending upon whether electric current flows into or out of it. FIG. 1 illustrates the case where the flow of electricity causes element 2 to elongate. When this condition occurs, the piezoelectric element 2, which is secured to the sound radiating diaphragm 1, deforms the diaphragm 1 as shown. (It is understood the extend of deformation is exaggerated for the purpose of illustration.) It should be noted that bottom layer **2*b* of piezoelectric element 2, which is bonded to the sound radiating diaphragm 1, is constrained in its motion due to the bending stiffness of diaphragm 1, while top layer 2*a* is completely unconstrained, except for the internal shear constraint of the piezoelectric material itself. As a result of the lack of constraint of the piezoelectric element 2, except for layer 2*b* bonded to the sound radiating diaphragm 1, layer 2*a* of element 2 farthest from the diaphragm 1 has greater elongation as shown in FIG. 1. The actual elongations are shown magnified for illustrative purposes. It has been discovered that all "layers" (the edges of which are shown by dotted lines 5) of piezoelectric element 2 above and parallel to layer 2*b* of piezoelectric element 2 have a greater elongation than layer 2*b* and that the forces generated within piezoelectric element 2 by such other layers are not coupled to the sound radiating diaphragm 1. Therefore, there is a considerable waste of electrical energy when a piezoelectric element is directly bonded to a diaphragm as per FIG. 1**.

Figure 2:
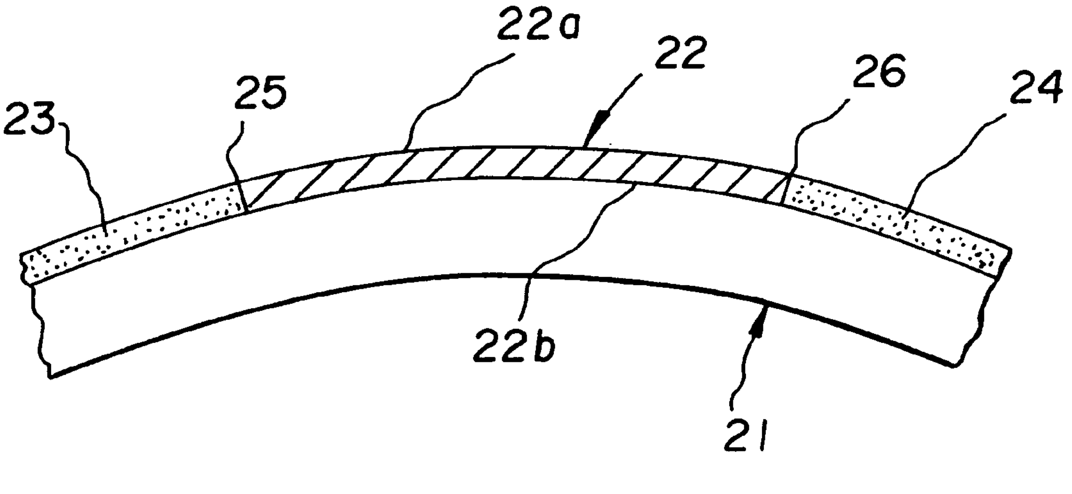
FIG. 2 illustrates one embodiment of the present invention in which a piezoelectric element is utilized in conjunction with motion couplers to drive a diaphragm.

FIG. 2 shows a sound radiating diaphragm 21 with a piezoelectric element 22 bonded to it. In addition, and in accordance with the present invention, motion couplers 23 and 24 are also bonded both to diaphragm 21 and to, respectively, edges 25 and 26 of piezoelectric element 22. As used herein, the term "motion coupler" is defined as a non-piezoelectric material that is attached to the sides (i.e. edges) of a relatively flat piezo electric material. In general, the lower surface of a motion coupler will be planar with the lower (i.e. bottom or inner, relative to the diaphragm) surface of the piezoelectric material. When the piezoelectric material is excited the resulting force of motion will be transferred laterally to the attached motion couplers.

As opposed to the configuration set forth in FIG. 1, when the piezoelectric element 22 as shown in FIG. 2 deforms diaphragm 21 all or nearly all of the force generated within the volume of the piezoelectric element 22 is transferred from the element 22 to diaphragm 21 by means of motion coupler 23 and 24. All of the intermediate parallel layers (not shown) of the piezoelectric element 22 above and parallel to layer 22*b* that is bonded to diaphragm 21 are coupled to motion couplers 23 and 24. Motion couplers 23 and 24 transfer the force and motion of piezoelectric element 22 to the diaphragm 21.

In summary, without utilizing motion couplers, only the bottom layer of the piezoelectric element bonded to the diaphragm stretches or compresses the diaphragm. The top layer and intermediate layers are free to elongate or shorten more or less as though the piezoelectric element was completely unconstrained.

On the other hand, the entire volume of the piezoelectric element and all of the force and motion generated by it may be utilized advantageously with motion couplers. Hence, greater force and elongation or contraction is imparted to the diaphragm. That is, much more of the electrical energy imparted to the piezoelectric element is transferred to the diaphragm. In fact, the parallel layers of the piezoelectric element closest to layer 22*a* and farthest from the layer 22*b* that is bonded to the diaphragm will impart more force due to the fact that they are farther from the neutral axis of bending of the composite plate formed by motion couplers 23 and 24, piezoelectric element 22 and diaphragm 21. Thus, through the use of motion couplers a larger diaphragm may be effectively utilized per unit size of a piezoelectric element.

Assuming the piezoelectric element is thin and a relatively flat structure, it is most favorable if the motion couplers are attached to each of the edges of the piezo element. Obviously, the motion couplers and the piezoelectric element and the motion couplers are adhered to the substrate or directly to the diaphragm over their entire bottom areas.

The motion couplers are preferably the same thickness as the piezoelectric material but in other embodiments may be thinner or thicker than the piezoelectric material.

Preferably, the surface area of all the motion couplers attached to a given piezoelectric material will preferably range from about 0.75 times to about 10 times the surface area of the piezoelectric material and most preferably 1.5 times to about 5 times the surface area of the piezoelectric material. When motion couplers having a total surface area, relative to the piezoelectric material approximately in the above range are utilized in conjunction with a piezoelectric material, a diaphragm can effectively be driven by said piezoelectric material that has a total surface area broadly ranging from about 20 to about 300 times or more of the surface area of the piezoelectric elements, more preferably from about 20 to about 200 times the surface area of the piezoelectric elements and most preferably about 20 to about 150 times the surface area of the piezoelectric elements. By contrast it has been established that piezoelectric material that is directly attached to a diaphragm without benefit of motion couplers can effectively drive a diagram having a surface are that is, at most, only about 5 times the surface area of the piezoelectric material, as determined by comparing the volume of sound produced by the diaphragm. The term "effectively drive" as used herein is understood to mean that the element can drive a diaphragm to put out a sufficient amount of distortion free sound so that the diaphragm can be utilized in a commercial loudspeaker.

It should be noted that the use of motion couplers that have a surface area, relative to the surface area of the piezoelectric element (or other methods of transduction mentioned below) outside of the above range will still produce beneficial results. However, diminishing returns may set in when motion couplers having a surface area greater than 10 times the surface area of the transduction elements are utilized. Likewise, the use of motion couplers having a surface area less than 0.75 times the surface are of the transduction element would bring beneficial results compared to using a transduction element without motion couplers.

Figure 3:
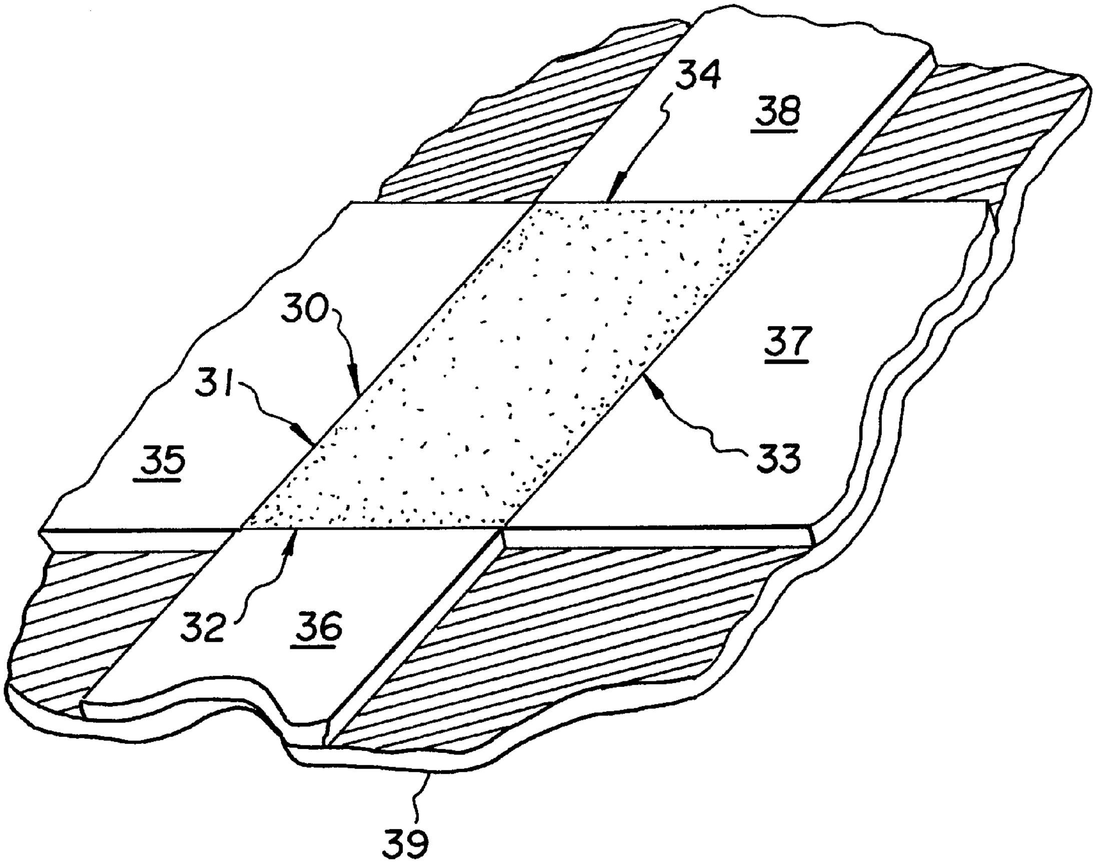
FIG. 3 illustrates a further embodiment of the present invention in which a piezoelectric element is shown as being utilized in conjunction with motion couplers and a substrate.

The favorable results from utilizing the motion couplers may be enhanced by using a substrate of a suitable material which is directed attached to the diaphragm and is located between the diaphragm and the piezoelectric material as shown in FIG. 3, which illustrates another embodiment of the present invention in which piezoelectric element 30, which in the illustration has a rectangular shape (although any other shaped piezoelectric element can be utilized in this embodiment) is coupled on, most preferably, all its sides 31,32,33 and 34 with motion couplers 35,36,37,38 to further ensure the coupling of the motion of piezoelectric element 30 to substrate 39 by providing a coupling transition to the substrate, to which piezoelectric element 30 is bonded and positioned on top of, in all directions of movement. Ideally, substrate 39 will have larger surface area than the flat piezoelectric element 30 in order to impart motion to a larger area of the diaphragm than if the substrate alone was attached to the diaphragm. Thus, lesser amounts of the piezoelectric material need be utilized. The substrate will ideally have a rigidity approximately the same as that of the piezoelectric material and greater than the rigidity of a diaphragm to which the substrate will be attached.

If desired, the motion couplers may be attached only to certain sides of the piezoelectric element 30, but, as indicated above, it is most preferred if motion couplers are attached to all the sides/edges of the piezoelectric element. By providing a coupling transition to the substrate it will be further insured that the motion of the piezoelectric element will be coupled to the diaphragm (not shown). This is accomplished by tightly coupling, preferably, both the transverse and lateral motions of the piezoelectric element, first to the motion couplers, with the end result that the motion will thereafter be passed through the substrate to the diaphragm. The motion couplers will also be attached to the substrate.

It has been discovered that the use of the motion couplers will not only permit the use of larger diaphragms but will increase the loudness of the sound produced by a given diaphragm and extend the bass sound produced to lower frequencies. In this regard, the frequency range may be broadened, and/or made smoother, by using more than one piezoelectric element with a given transducer. In this case, smaller piezoelectric elements can be used to reproduce higher frequencies. The frequency spectrum may be divided by typical means such as electronic filters, cross-over networks, digital signal processing means, etc. so that each piezoelectric element receives a certain band of frequencies appropriate to its size.

Similarly, a series of transducers of differing size may also be used to broaden and/or smother the frequency range. That is, when two or more piezoelectric elements are utilized, a frequency directing means may be also utilized to direct a specific frequency range of the sound to each piezoelectric element. Smaller transducers can be used for higher frequencies, and the frequency spectrum may be divided by electronic filters, cross-over networks, digital signal processing means, etc. so that each transducer receives a certain band of frequencies appropriate to its size.

It is also clear that using more than one piezoelectric element will increase the volume of sound that can be obtained from a given diaphragm. In the same manner, using two transducers excited by identical electrical signals will increase the volume of sound that can be obtained from a given diaphragm. Put another way, it has been discovered that if each piezoelectric element is electrically connected to the same electronic means there would be an increase in the sound output of the loudspeaker.

The stiffness of the various components, i.e. the diaphragm, the piezoelectric element, the motion couplers, and the adhesive used for bonding, must be chosen to be compatible. For instance, the motion couplers must be of approximately the same stiffness as the piezoelectric element. If the motion couplers are much softer than the piezoelectric element, then they cannot couple the forces and motions to the diaphragm. If the motion couplers are much more rigid than the piezoelectric element, then they can restrain the motion of the piezoelectric element and also reduce the forces and motions that can be imparted to the diaphragm. Similarly, the adhesive chosen for both the motion couplers, substrate and/or diaphragm should not be so soft that it cannot fully couple the motions of the various components to the diaphragm. The adhesive should not be so stiff as to impede or constrain the motion of the piezoelectric element. In effect, the adhesive selected must be more rigid that the diaphragm. While, for example, epoxies, acrylics and hot melt adhesives would be suitable adhesives for use in the present invention, rubber cement would typically be not suitable. Finally, the diaphragm stiffness must also be considered. If the diaphragm is too soft, the forces and motions of the piezoelectric element cannot be well coupled by the motion couplers. If the diaphragm is too stiff, it will not be so greatly deformed by the transducer and will inhibit the piezoelectric element and motion couplers from transferring their energy and motion to the diaphragm.

The piezoelectric material will of course be capable of propagating flexural acoustic waves and typically in a flat layer. The substrate layer will have essentially the same degree of rigidity (as characterized by its Young's modulus and thickness) as the piezoelectric electric material, but has more rigidity than the diaphragm material so that when the substrate material is distorted by the motion of the piezoelectric material the diaphragm will move accordingly. In this regard, the thickness of the substrate may be optimized to the properties of the piezoelectric material. The substrate will be larger in surface area than the piezoelectric element in order to impart motion to a larger area of the diaphragm. The invention also comprises utilizing multiple piezoelectric elements on a single diaphragm to extend the frequency range. In this case a larger element would be used to produce low frequencies and smaller elements would be used to produce higher frequencies. The use of multiple elements serves to increase the motion imparted to the diaphragm and, hence, the volume or loudness of the sound.

Many materials may advantageously be used for the motion couplers and/or substrate. These materials include steel, aluminum, brass, copper, and other metals, plastics, composite materials, etc. Brass is one preferred material because of its modest cost, environmental resistance, ease of bondability and because its Young's modulus of elasticity is similar to that of certain piezoelectric materials, such as PZT (lead zircon titanate).

The large diaphragm utilized in the present invention will be specifically selected for radiating sound so that the internal damping of the materials of construction and the configuration of the diaphragm itself provides internal energy absorption that suppresses resonances of the diaphragm and suppresses the formation of unwanted interference fields on the diaphragm.

The diaphragm may be a laminated structure of at least two different materials, with one of said layers comprising a moisture barrier or an insulating medium.

Typically, the preferred diaphragm utilized in the present invention will have a thickness ranging from about 0.125 inch to about 1 inch, and most preferably from about 0.188 inch to about 0.75 inch. When formed of multiple layers, the diaphragm will generally contain from about 2 to about 5 layers. The thickness of the transducer element (comprising the piezoelectric element used in concert with the motion couplers and any substrate) to be used in conjunction with the above diaphragm will typically range from about 0.03 inch to 0.2 inch. The substrate and/or the transducer element may be preformed, or otherwise configured, to conform to the curvature, or other shape, of the diaphragm to which it is attached. In a preferred embodiment, for maximum efficiency and minimum distortion both the mechanical and electrical impedances of the transducer should be matched. That is, the mechanical impedance of the transducer should be matched to that of the diaphragm while the electrical impedance of the amplifier that drives the transducer should be matched to that of the transducer when it is radiating sound.

The piezoelectric element, when utilized as a transducer, can have a wide variety of shapes, such as square, rectangular and round. Irregular shapes may also be used to extend the frequency range. To accomplish the latter goal, elliptical, semi-elliptical, truncated rectangular and truncated square shapes, etc. may be used.

Figure 4:
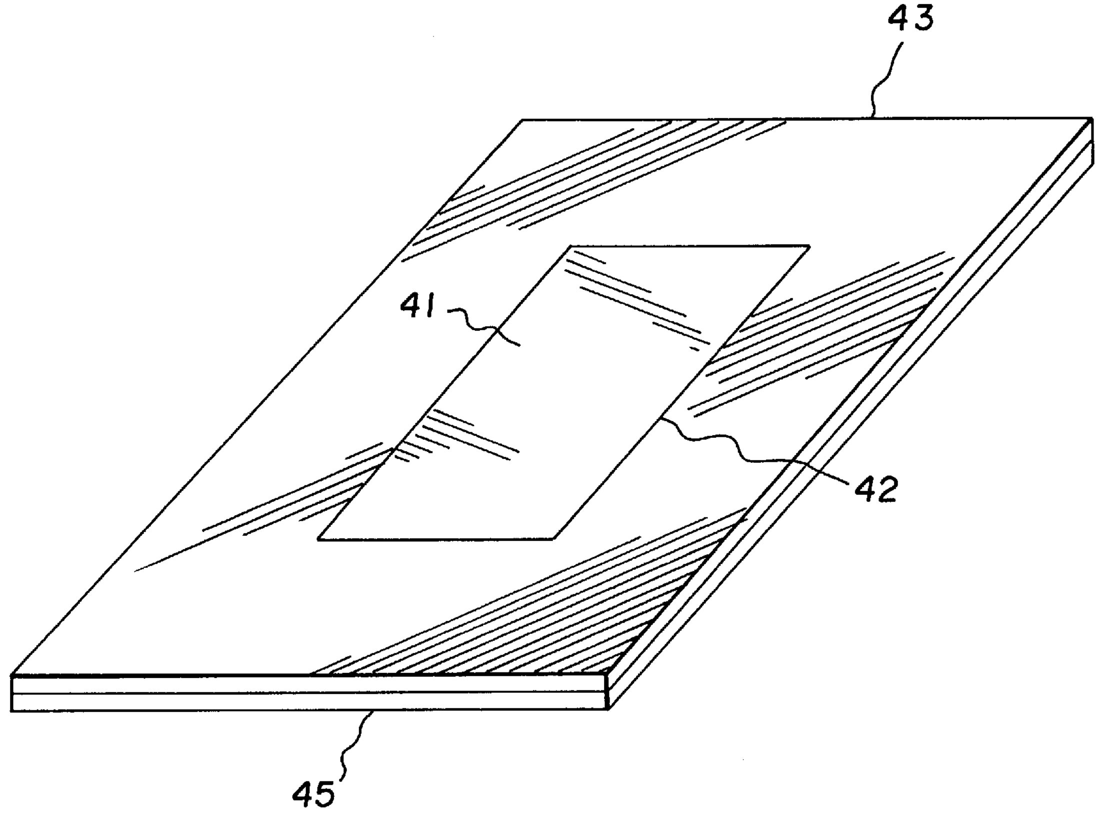
FIG. 4 illustrates a piezoelectric element being completely surrounded by a single motion coupling plate.

In another embodiment as shown in FIG. 4 the outer perimeter 42 of piezoelectric element 41 is completely surrounded by a single motion coupling plate 43. Motion coupling plate 43 has a hole, which in the depicted embodiment is in its center, which is cut out in order to accommodate the presence of element 41, which must fit the hole in motion coupling plate 43 very snugly so that the piezoelectric element 41 will be bonded at its edges 42 to the edges of the hole in motion coupling plate 43. Piezoelectric element 41 and motion coupling plate 43 are both bonded to the underlying substrate 45. The material of the motion coupling plate 43 and the substrate 45 may be of the same material or different materials such that the motion of piezoelectric element 41 is not substantially restricted.

Figure 5:
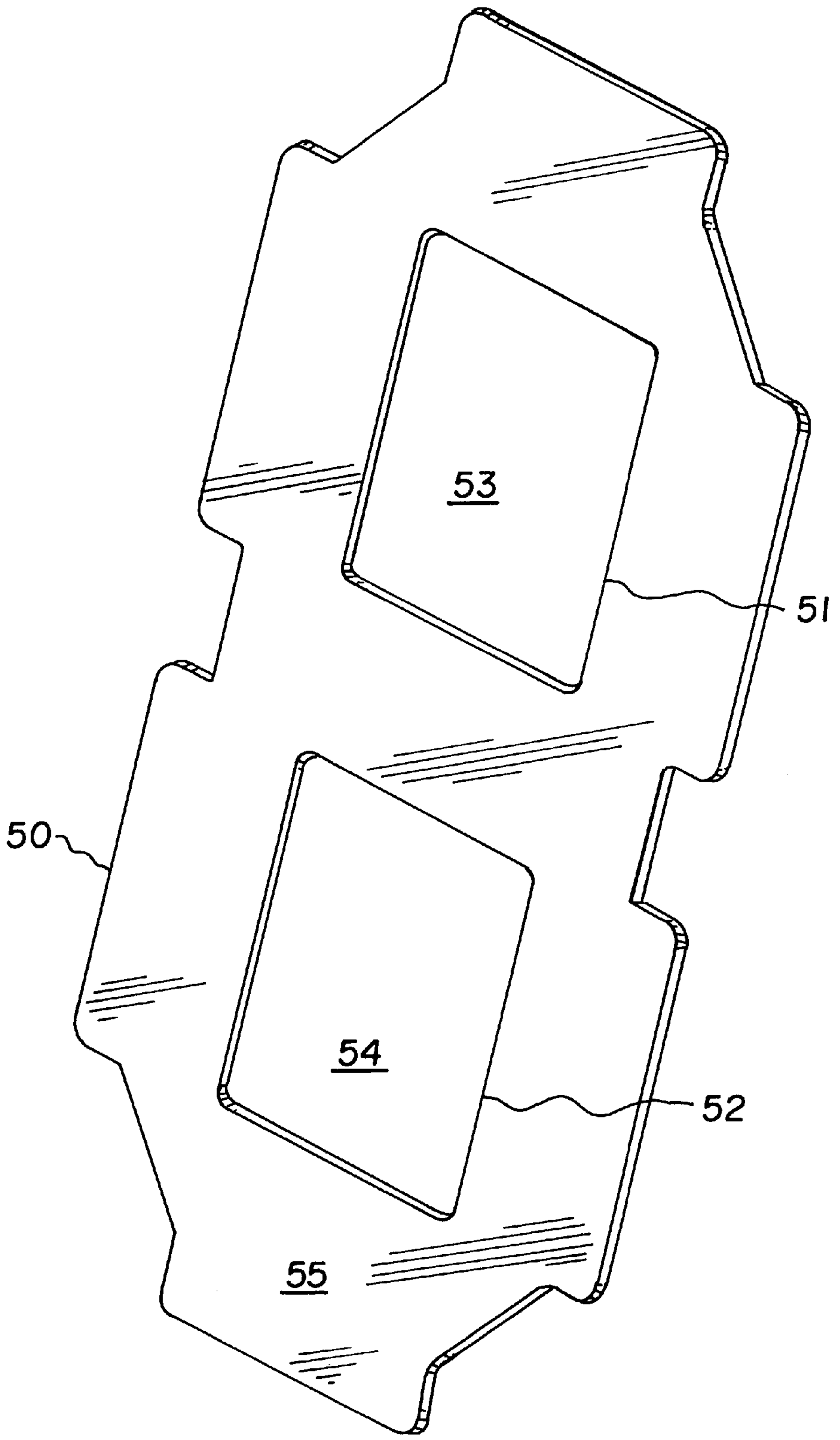
FIG. 5 illustrates a further embodiment of the present invention in which the substrate and motion coupler are formed from the same material and are shaped as an integral unit.

FIG. 5 illustrates a further embodiment of the present invention in which the substrate and motion coupler are formed from the same material and are shaped as an integral unit 50, which is substantially flat. As illustrated, piezoelectric elements 51 and 52, which are also substantially flat, are inset in a depression that is in unit 50, with the top sides 53 and 54 of, respectively, piezoelectric elements 51 and 52 being planar with the top side of 55 of unit 50. Alternatively, top sides 53 and 54 can extend above, or be below, side 55.

It has also been discovered that, as a further advantage of using relatively thin transducers that incorporate motion couplers, free standing diaphragms may be advantageously utilized. It was previously believed that diaphragms had to be constrained, i.e. such as stretching a diaphragm across a frame and securing its edges against the frame, or otherwise tightly constraining the diaphragm around its edges. It has now been discovered that with the transducers of the present invention that free hanging diaphragms, i.e. diaphragms that are free hanging or otherwise not constrained around their edges or are only very loosely constrained, can be effectively utilized as a sound radiating member. By loosely constrained it is understood to mean a diaphragm that is not securely attached to a supporting structure such as a frame but may be supported, such as by a plurality of brackets as would be a headliner in an automobile.

The forgoing is considered as illustrative only of the principles of the invention. Further, since numerous modifications and changes will readily occur to those skilled in the art, it is not desired to limit the invention to the exact construction and operation shown and described. For example, even though piezoelectric transducers are preferred and are primarily described, it is understood that the transducers may utilize other elements in accordance with the invention, as long as they are fashioned in the form of relatively thin plates that would interact with motion couplers. For example, suitably constructed magneto-strictive, electro-magnetic, electro-static or micro-motor elements may be utilized in the transducers. None of the aforementioned materials can be fashioned as thinly and/or as cheaply as piezoelectric elements, which is one of the reasons the piezoelectric elements are favored in the present invention.

Accordingly, all suitable modifications and equivalents may be resorted to, falling within the scope of the invention.

What is claimed is:

1. An assembly for utilization in a loudspeaker system comprising:

at least one piezoelectric element capable of being excited by applied electric potential, said piezoelectric element having an upper side, an under side and an outer perimeter, a diaphragm that is driven by the excited piezoelectric element, said diaphragm having opposed faces and a surface are that is at least 20 times the surface are of the piezoelectric element, wherein at least some of the under side of the piezoelectric element is attached to one face of said diaphragm; and at least one motion coupler having an upper side and an under side and an outer edge, which motion coupler is attached by at least a portion of its outer edge to at least a portion of the outer perimeter of the piezoelectric element and on its under side to said one face of the diaphragm, wherein the total surface area of all motion couplers is at least about 0.75 times the surface area of the piezoelectric element.

2. The assembly of claim 1 further comprising electronic means electrically connected to said piezoelectric element to apply electric potential thereto.

3. The assembly of claim 1 wherein the diaphragm has a surface are that is from about 20 to about 300 times the surface area of the piezoelectric elements.

4. The assembly of claim 3 wherein the diaphragm has a surface area that is from about 20 to about 200 times the surface area of the piezoelectric elements.

5. The assembly of claim 4 wherein the diaphragm has a surface area that is from about 20 to about 150 times the surface are of the piezoelectric elements.

6. The assemble of claim 1 wherein the diaphragm has a thickness of from about 0.125 inch to about one inch.

7. The assembly of claim 1 wherein the motion couplers have a total surface area that is from about 0.75 to about 10 times the surface area of the piezoelectric element.

8. The assembly of claim 1 wherein the diaphragm has a substantially flat portion to which the under side of the piezoelectric element is joined.

9. The assembly of claim 1 further comprising a substrate having an upper side and a lower side, with the upper side of the substrate being joined to the underside of the piezoelectric element, said substrate having a larger surface are than the piezoelectric element and having substantially the same rigidity as the piezoelectric element but a greater rigidity than the diaphragm to which the lower side of the substrate is attached.

10. The assembly of claim 9 wherein the substrate is brass.

11. The assembly of claim 9 wherein the at least one motion coupler is comprised of the same material as the substrate.

12. The assembly of claim 9 wherein the substrate and motion coupler are formed into a flat integrated unit in which the substrate and motion coupler are formed from the same material, said unit having an upper side and a lower side and having substantially the same rigidity as the piezoelectric element but a greater rigidity than the diaphragm to which the lower side of the unit is adjacent, said unit further having a depression on its upper side for the piezoelectric element, with the piezoelectric element being inset into said depression.

13. The assembly of claim 9 wherein there are two piezoelectric elements.

14. The assembly of claim 9 wherein there are more than two piezoelectric elements.

15. The assembly of claim 9 in which there are two or more piezoelectric elements, and further comprising electronic means for applying electrical potential to said piezoelectric elements, with each piezoelectric element being electrically connected to the same electronic means to thereby increase the sound output of the loudspeaker.

16. The assembly of claim 9 wherein two or more piezoelectric elements are utilized, and further comprising frequency directing means to direct a specific frequency range of the sound to each piezo electric element.

17. The assembly of claim 12 wherein the upper side of the piezoelectric element is planar with the upper side of the unit.

18. The assembly of claim 1 wherein the at least one motion coupler is brass.

19. The assembly of claim 1 wherein the at least on motion coupler is in one piece which completely surrounds the piezoelectric element.

20. The assembly of claim 1 wherein the at least one motion coupler is not as thick as the piezoelectric element.

21. The assembly of claim 1 wherein the at least one motion coupler is thicker than the piezoelectric element.

22. An assembly for utilization in a loudspeaker system comprising:

at least one transducer, said transducer including at least one element capable of being excited by applied electric potential, said element having an upper side, and under side and an outer perimeter, a diaphragm that is driven by the excited transducer, said diaphragm having opposed faces and a surface area that is at least 20 times the surface area of the at least one element, wherein at least some of the under side of the element is attached to one face of said diaphragm, and at least one motion coupler having an upper side and an under side and an outer edge, which motion coupler is attached by at least a portion of its outer edge to at least a portion of the outer perimeter of the at least one element and on its underside to said one face of the diaphragm, wherein the total surface are of all motion couplers is at least about 0.75 times the surface are of the at least one element.

23. The loudspeaker system of claim 22 wherein the element is a magneto-strictive element.

24. The loudspeaker system of claim 22 wherein the element is a electro-magnetic element.

25. The loudspeaker system of claim 22 wherein the element is a electro-static element.

26. The loudspeaker system of claim 22 wherein the element is a micro-motor element.

27. The assembly of claim 22 in which there are two or more transducers, and further comprising electronic means for applying electrical potential to said transducers, with each transducer being electrically connected to the same electronic means to thereby increase the sound output of the loudspeaker.

28. The assembly of claim 22 wherein two or more transducers are utilized, and further comprising frequency directing means to direct a specific frequency range of the sound to each transducer.

29. An assembly for utilization in a loudspeaker system comprising:

at least one thin transducer element capable of being excited by applied electric potential, said element having an upper side, and under side and an outer perimeter, a diaphragm that is driven by the excited element, said diaphragm having opposed faces and being a free hanging structure that is not constrained or is only loosely constrained around its edges; and at least one motion coupler having an upper side and an under side and an outer edge, which motion coupler is attached by at least a portion of its outer edge to at least a portion of the outer perimeter of the element and on its underside to said one face of the diaphragm, wherein the total surface are of all motion couplers is at least about 0.75 times the surface are of the element.

30. A transducer system for imparting motion to a diaphragm having opposed faces, the system comprising:

a piezoelectric element subject of displacement by applied electric potential and having a top side, an under side and an outer perimeter, wherein at least some of the under side of the piezoelectric element is adapted to be attached to one face of the diaphragm;

at least one motion coupler for receiving motion laterally from the piezoelectric element and having an upper side and an under side and an outer edge, which motion coupler is attached by at least a portion of its outer edge to at least a portion of the outer perimeter of the piezoelectric element and is adapted to be attached on its under side to said one face of the diaphragm, wherein the total surface are of all motion couplers is at least about 0.75 times the surface are of the piezoelectric element; and means to apply electric potential to the piezoelectric element.

31. An assembly for utilization in a loudspeaker system comprising:

at least one piezoelectric element capable of being excited by applied electric potential, said piezoelectric element having an upper side, an under side and an outer perimeter, a diaphragm that is driven by the excited piezoelectric element, said diaphragm having opposed faces and a surface area that is at least 20 times the surface area of the piezoelectric element, a substrate having an upper side and a lower side, said substrate having a larger surface area than the piezoelectric element and substantially the same rigidity as the piezoelectric element but a greater rigidity than the diaphragm, wherein at least some of the under side of the piezoelectric element is attached to the upper side of the substrate, and the lower side of the substrate is attached to one face of said diaphragm; and at least one motion coupler having an upper side and an under side and an outer edge, which motion coupler is attached by at least a portion of its outer edge to at least a portion of the outer perimeter of the piezoelectric element and on its under side to the upper side of the substrate.

32. The assembly of claim 31 wherein the substrate is brass.

33. The assembly of claim 31 wherein the at least one motion coupler is comprised of the same material as the substrate.

34. The assembly of claim 31 wherein the substrate and motion coupler are formed into a flat integrated unit in which the substrate and motion coupler are formed from the same material, said unit having an upper side and a lower side and having substantially the same rigidity as the piezoelectric element but a greater rigidity than the diaphragm to which the lower side of the unit adjacent, said unit further having a depression on its upper side for the piezoelectric element, with the piezoelectric element being inset into said depression.

35. The assembly of claim 31 wherein there are two piezoelectric elements.

36. The assembly of claim 31 wherein there are more than two piezoelectric elements.

37. The assembly of claim 31 in which there are two or more piezoelectric elements, and further comprising electronic means for applying electrical potential to said piezoelectric elements, with each piezoelectric element being electrically connected to the same electronic means to thereby increase the sound output of the loudspeaker.

38. The assembly of claim 31 wherein two or more piezoelectric elements are utilized, and further comprising frequency directing means to direct a specific frequency range of the sound to each piezoelectric element.

39. The assembly of claim 31 wherein the upper side of the piezoelectric element is planar with the upper side of the unit.

* * * * *